United States Patent [19]

Uno et al.

[11] Patent Number: 5,008,002
[45] Date of Patent: Apr. 16, 1991

[54] PROCESS FOR PRODUCING MOLD USED FOR OBTAINING PRESS MOLDED GLASS ARTICLE

[75] Inventors: Ken Uno, Fussa; Takuo Fujino, Akishima; Hideki Nakamori, Kashiwa, all of Japan

[73] Assignees: Hoya Corporation; Prometron Technics Corporation, both of Tokyo, Japan

[21] Appl. No.: 467,248

[22] Filed: Jan. 19, 1990

[30] Foreign Application Priority Data

Jan. 30, 1989 [JP] Japan .................................. 1-20545

[51] Int. Cl.$^5$ .......................... B05D 3/06; C23C 14/00
[52] U.S. Cl. ......................... 204/192.31; 204/298.05; 264/338; 427/38; 427/133; 427/249
[58] Field of Search ...................... 204/192.11, 192.31, 204/298.05; 427/38, 39, 133, 134, 135, 249; 264/337, 338

[56] References Cited

U.S. PATENT DOCUMENTS

| H 566 | 1/1989 | Nyaiesh et al. ........................ 427/38 |
| 3,604,970 | 9/1971 | Culbertson et al. .............. 427/39 X |
| 3,961,103 | 6/1976 | Aisenberg .............................. 427/39 |

Primary Examiner—Nam X. Nguyen
Attorney, Agent, or Firm—Nixon & Vanderhye

[57] ABSTRACT

The present invention relates to a process for producing a mold for glass press molding which comprises adopting, in the ion plating method to form an i-carbon film, a given hydrocarbon, given voltages, given temperature conditions, etc. According to the process, there could be obtained a mold for glass press molding, having an i-carbon film superior in adhesion to mold base, hardness, lubricity, etc. In this mold for glass press molding, the i-carbon film is less susceptible to peeling and glass releasability is good even after many times of press molding. Therefore, the mold can be used for glass press molding over a long period of time.

5 Claims, 2 Drawing Sheets

PROCESS FOR PRODUCING MOLD USED FOR OBTAINING PRESS MOLDED GLASS ARTICLE

BACKGROUND OF THE INVENTION

1. Field of the Invention

The present invention relates to a process for producing a mold used for obtaining a press molded glass article and more particularly to a process for producing a mold used for obtaining a press molded glass article such as glass lens or the like.

2. Description of the Prior Art

In production of glass lens by press molding, the surface pattern of a mold used is transferred as such onto the surface of a glass lens to be produced; therefore, the surface of the mold must have the same precision and roughness as required for the surface of glass lens. Accordingly, the mold used for press molding of glass are required to, for example, (a) cause no chemical reaction to glass at high temperatures, (b) have excellent oxidation resistance and heat resistance, (c) have such a sufficiently high hardness as to cause no structural change or no plastic deformation at the time of press molding and (d) exhibit good machinability at its production and have a very small frictional resistance at the surface.

As the mold used for press molding, there have conventionally been used molds made of WC, Si, $Si_3N_4$, etc. These molds, however, invite adhesion of glass to the surfaces. To prevent such glass adhesion, it was proposed to form a releasable carbon film on the mold surface.

For example, Japanese Patent Publication Kokai (Laid-Open) No. 281030/1986 discloses a process for forming, on the surface of a mold for press molding, a diamond-like carbon film at a high temperature according to a microwave plasma CVD method using, as a material gas, a mixture of $CH_4$ and $H_2$.

This diamond-like carbon film formed at a high temperature according to a microwave plasma CVD method has excellent heat resistance and oxidation resistance and a high hardness, so that the formation of flaw, etc. can be prevented on the mold surface. However, being a polycrystalline film consisting of diamond crystallites, the carbon film has large projections and depressions on the surface and requires a polishing step in order to obtain a mold having a good surface roughness. Further, the microwave plasma CVD method has poor reproducibility and moreover is unsuitable for obtaining a diamond-like carbon film of large surface area. Furthermore, when the mold surface has been stained or part of the film has been peeled during press molding, it is difficult to regenerate the mold surface or film.

Also, Japanese Patent Application Kokai (Laid-Open) No. 242922/1986 discloses a process for forming a diamond-like carbon film on the surface of mold for press molding, at a low temperature according to an ion beam sputtering method.

This diamond-like carbon film formed at a low temperature according to an ion beam sputtering method is amorphous, has properties close to those of diamond, and is very hard and has good lubricity at room temperature. However at high temperatures of 500° C. or more which are the temperature range of press molding, the carbon film changes to a graphite structure and comes to have reduced hardness and reduced heat resistance.

As another releasable carbon film, there are a glassy carbon film and a graphite film. However, these films have poor heat resistance and poor oxidation resistance.

SUMMARY OF THE INVENTION

Hence, the object of the present invention is to provide a mold for obtaining a press molded glass article, which mold is free from the drawbacks of conventional molds having a releasable carbon film such as diamond-like carbon film formed according to a microwave plasma CVD method or an ion beam sputtering method.

According to the present invention, there is provided a process for producing a mold used for obtaining a press molded glass article, which comprises a step of forming an i-carbon film on a base of a mold for obtaining a press molded glass article (the base is hereinafter referred to as "mold base"), according to an ion plating method, wherein said ion plating method is effected by, in an ion plating apparatus comprising an anode electrode, a first cathode electrode, a holder for holding said mold base and a reflector extending as far as the vicinity of the mold base holder in such a shape that it surrounds the two electrodes, applying a low voltage between the anode electrode and the first cathode electrode to generate a plasma of ions of a hydrocarbon having a C/H ratio (a ratio of carbon atoms to hydrogen atoms) of $\frac{1}{3}$ or more, and further applying a voltage of 0.5-2.5 KV between the mold base holder and the anode electrode so that the mold base holder becomes a second cathode electrode relative to the anode electrode while keeping the reflector at the same potential as the first cathode electrode, to accelerate the hydrocarbon ions to the direction of the mold base being kept at 200°–400° C.

In a preferred embodiment of the present invention, it is preferable to effect an ion bombardment treatment prior to the ion plating method.

DETAILED DESCRIPTION OF THE INVENTION

Figure 1:
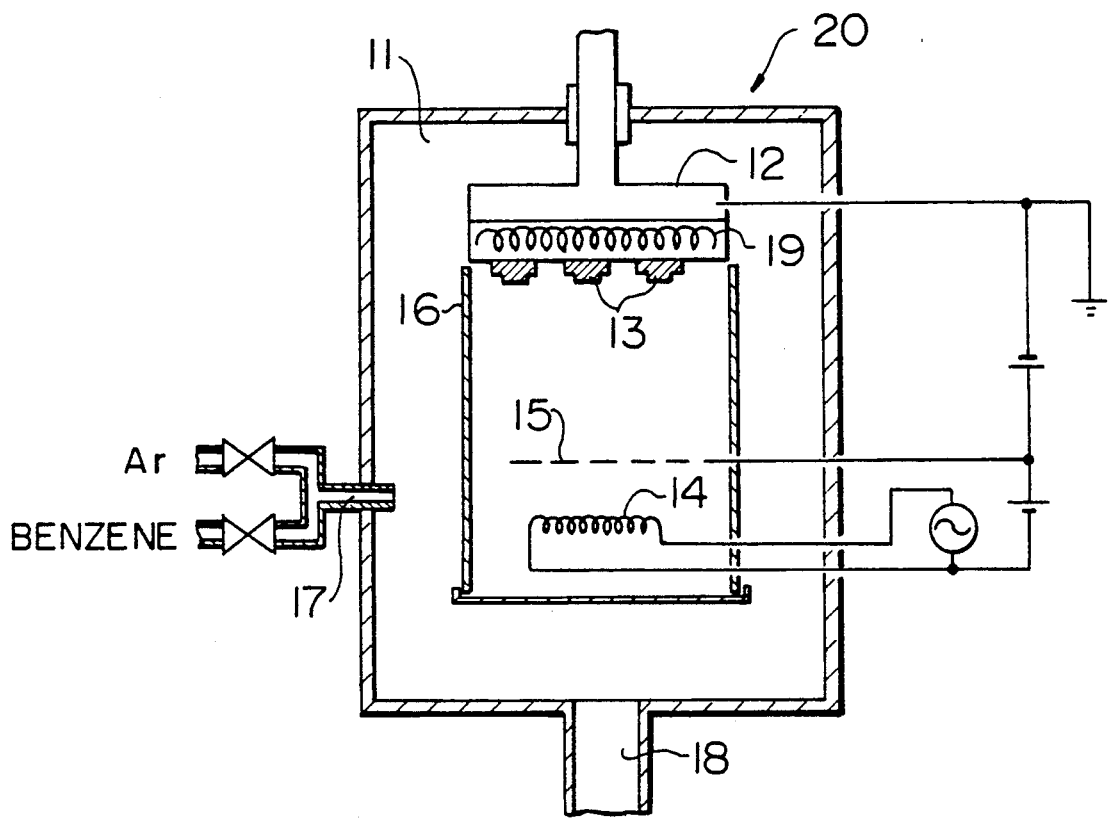
FIG. 1 is a schematic illustration of an ion plating apparatus suitable for effecting the process of the present invention.

The present invention is described in detail below.

The process of the present invention for producing a mold used for obtaining a press molded glass article comprises a step of forming, according to an ion plating method, an i-carbon film (an amorphous hard carbon film) on a mold base which is cut and polished so as to have the same shape as a mold to be produced.

As the material for mold base, there may be used silicon (Si), silicon nitride ($Si_3N_4$), tungsten carbide (WC), a cermet of alumina ($Al_2O_3$) and titanium carbide (TiC), etc. However, sintered silicon carbide (SiC) is preferred. This sintered SiC preferably has a SiC film formed by a CVD method, on the surface which is to contact with glass during press molding.

The ion plating method is effected using an ion plating apparatus comprising an anode electrode, a first cathode electrode, a holder for holding a mold base, and a reflector extending as far as the vicinity of the mold base holder in such a shape that the reflector surrounds the two electrodes. In this ion plating apparatus, a low voltage is applied between the anode electrode and the first cathode electrode to generate a plasma of hydrocarbon ions. The low voltage applied between the two electrodes is preferably 50–150 V. When the voltage is less than 50 V, the ionization of hydrocarbon is low and the degree of the resulting ion plating is insufficient. When the voltage is more than 150 V, the resulting plasma is unstable. The hydrocarbon used is restricted to those having a C/H ratio (a ratio of carbon atoms to hydrogen atoms) of $\frac{1}{3}$ or more. Examples of the hydrocarbon include aromatic hydrocarbons such as benzene (C/H=6/6), toluene (C/H=$\frac{7}{8}$), xylene (C/H =8/10) and the like; unsaturated hydrocarbons containing a triple bond, such as acetylene (C/H=2/2), methylacetylene (C/H=$\frac{3}{4}$), butyne (C/H=4/6) and the like; unsaturated hydrocarbons containing a double bond, such as ethylene (C/H=2/4), propylene (C/H=3/7), butene (C/H=4/8) and the like; and saturated hydrocarbons such as ethane (C/H=2/6), propane (C/H=$\frac{3}{8}$), butane (C/H=4/10) and the like. These hydrocarbons can be used alone or in admixture of two or more.

It is found that methane having a C/H ratio of less than $\frac{1}{3}$ (C/H=$\frac{1}{4}$) and oxygen- or nitrogen-containing hydrocarbon compounds (e.g. acetone, acetic acid, alcohols (methanol, ethanol, propanol, etc.), dioxane, aniline, pyridine) are insufficient in at least either of formability of releasable film and releasability of press molded article and accordingly unsuited for practical use.

In the present invention, a voltage of 0.5–2.5 KV is applied between the mold base holder and the anode electrode so that the mold base holder becomes a second cathode electrode relative to the anode electrode. The reason for restricting the voltage between 0.5 KV and 2.5 KV is as follows. When the voltage is less than 0.5 KV, the acceleration of hydrocarbon ions is insufficient; the adhesion of i-carbon film to mold base is weak; accordingly, when the resulting mold is used for press molding of glass, there occurs adhesion of glass to mold at low press molding times. When the voltage is more than 2.5 KV, abnormal discharge tends to occur and the resulting mold has a rough surface.

In the present invention, the mold base must be kept at 200°–400° C. during the ion plating treatment.

Figure 3:
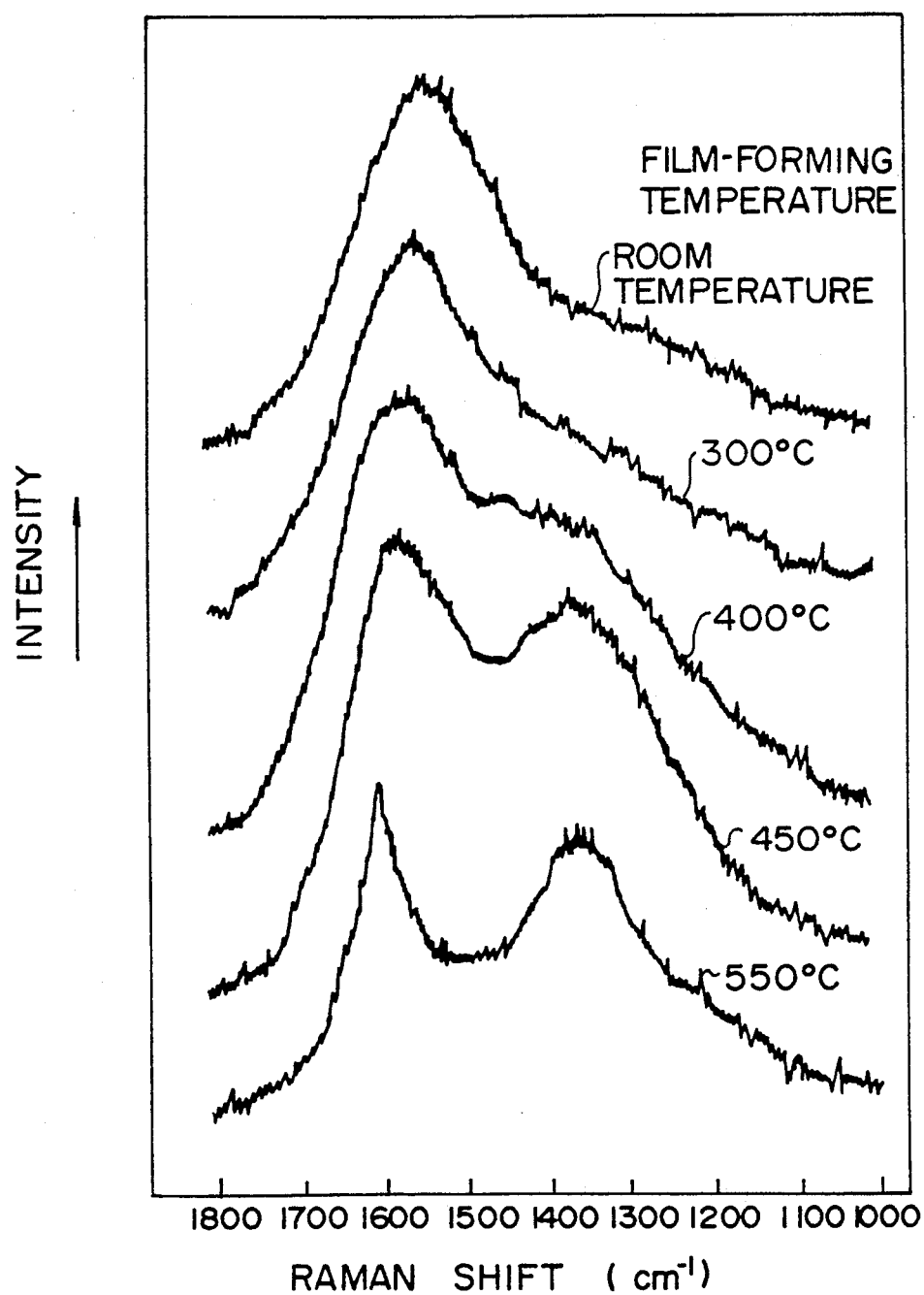
FIG. 3 is Raman specta obtained by laser Raman spectroscopy, showing that the temperature employed for the formation of a film on a mold base has a close connection with the structure of the film formed.

The mold base is heated to 200°–400° C. to form an i-carbon film thereon, because the present inventors found by laser Raman spectroscopy that the temperature at which a film is formed on the mold base has a close connection with the structure of the film formed. i-Carbon is defined as a carbon showing a wide peak at 1,550 cm$^{-1}$ in laser Raman spectroscopy and is regarded to be an amorphous carbon. When the peak at 1,550 cm$^{-1}$ shifts to a 1,600 cm$^{-1}$ side and there grows a peak at 1,360 cm$^{-1}$ showing the disoder of crystal lattices, it is believed that graphitization has occurred. FIG. 3 shows Raman spectra of films formed on a disc-shaped SiC at room temperature, 300° C., 400° C., 450° C. and 550° C., respectively. The films formed at room temperature and 300° C. can be identified to be those having an i-carbon structure; in the films formed at 400° C. and 450° C., there is a tendency that the peak intensity at 1,360 cm$^{-1}$ is larger and the main peak is shifted to a 1,600 cm$^{-1}$ side; the tendency is more striking in the film formed at 550° C., and this film is regarded to have a graphite structure. In order to make clear the difference of the thus formed i-carbon film and graphite film, these films were measured for hardness using Dynamic Ultra Micro Hardness Tester DUH-50 manufactured by Shimadzu Corp. and the resulting hardnesses were converted to corresponding Vickers hardnesses. As a result, the films formed at room temperature to 300° C. had a Vickers hardness of 3,000–3,400; the film formed at 400° C. had a Vickers hardness of 2,400; and the films formed at 500° C. or above had a Vickers hardness of 1,500. Further when the formed films were subjected to a scratch test, the films formed at room temperature to less than 200° C. caused shell-shaped peeling at the both ends of the scratch and were weak, while the films formed at 200° C. or more caused no such peeling and were tough. Furthermore when the formed films were subjected to a 650° C. annealing test in a nitrogen atmosphere in order to examine their heat resistances, the films formed at more than 400° C. caused peeling from the SiC film surface in one hour, and the films formed at room temperature to less than 200° C. caused overall lifting of carbon film from the mold base surface, right after the start of heating and were inferior in heat resistance. In contrast, the films formed at 200° C. to 400° C. showed no deterioration after 30 hours.

The above are the reasons for restricting the temperature of mold base to 200°–400° C. during ion plating. These matters are thoroughly shown in Examples and Comparative examples which are given below.

The present invention is described more specifically by way of Examples and Comparative Examples.

EXAMPLE 1

Sintered SiC was used as a material for a base of a mold for glass press molding. The sintered SiC was cut into a shape of said mold. Then, on the very surface of the shaped sintered SiC which was to contact with glass during glass press molding was formed a Sic film according to a CVD method. Further, cutting and polishing were effected to allow the SiC film to have a mirror surface to obtain a mold base. Thereafter, an i-carbon film was formed on the SiC film of the mold base according to an ion plating method using an ion plating apparatus shown in FIG. 1. In the ion plating apparatus 20 shown in FIG. 1, a mold base holder 12 accommodating a heater 19 is provided at the upper portion of a vacuum chamber 11; a mold base 13 having a SiC film is held by the holder 12; at the lower portion of the vacuum chamber 11 facing the mold base holder 12 are provided a first cathode electrode 14 consisting of a Ta filament and an anode electrode 15 which is a grid of W wire; a cylindrical reflector 16 is provided so as to extend as far as the vicinity of the mold base holder 12 in such a shape that the reflector 16 surrounds the two electrodes 14 and 15. The purpose of providing the reflector 16 is to direct the plasma generated between the two electrodes 14 and 15, to the mold base 13 and not to the side wall of the vacuum chamber 11 when the reflector 16 is kept at the same potential as the first cathode electrode 14. In FIG. 1, the numeral 17 is inelts for argon gas and benzene gas, and the numeral 18 is an exhaust port for making vacuum the inside of the vacuum chamber 11.

The vacuum chamber 11 was exhausted via the exhaust port 18 to a vacuum of $5.0 \times 10^{-6}$ Torr. The vacuum chamber 11 was kept at $8.0 \times 10^{-4}$ Torr by introducing argon gas through the gas inlet 17, and a voltage of 70 V was applied between the first cathode electrode 14 and the anode electrode 15 to generate a plasma and ionize the argon gas with the thermoelectrons emitted from the first cathode electrode 14. Further, a voltage of 1.0 KV was applied between the mold base holder 12 and the anode electrode 15 to accelerate the argon ions and ion-bombard the surface of the mold base 13 to clean the surface. In view of the overall movement of the ions, the mold base holder 12 can be regarded as a cathode electrode relative to the anode electrode 15 and, as described previously, is referred to as a second cathode electrode. The mold base holder 12, i.e. the second cathode electrode is kept at a ground potential for safe operation.

The above explanation has been given for easy understanding of the principle of the ion plating apparatus. Actually, to keep the mold base holder 12 at a ground potential, a potential of 1.0 KV is applied to the anode electrode 15. This potential (1.0 KV) is preferably applied before the filament of the first cathode electrode 14 is heated to generate a plasma. In this ion bombardment step, it is not necessary to heat the mold base 13; however, its heating in the ion bombardment step is desirable in view of (a) better cleaning effect for mold base surface and (b) heating required in the subsequent film formation step.

Then, the vacuum chamber 11 was again exhausted to a vacuum, and benzene gas was introduced thereinto through the gas inlet 17 to keep the vacuum inside the vacuum chamber 11 at $9.0 \times 10^{-4}$ Torr. Then, an ion plating step was effected in accordance with the basically same procedure as in the ion bombardment step. That is, a voltage of 70 V was applied between the first cathode electrode 14 and the anode electrode 15 to generate a plasma of benzene ions; further, a voltage of 1.0 KV was applied between the mold base holder 12 (which is the second cathode electrode) and the anode electrode 15, and the reflector 16 was kept at the same potential as the first cathode electrode 14 to accelerate the benzene ions to the direction of the mold base 13 to form an i-carbon film of 600 Å in thickness on the surface of the mold base 13 being previously heated at 300° C.

Figure 2:
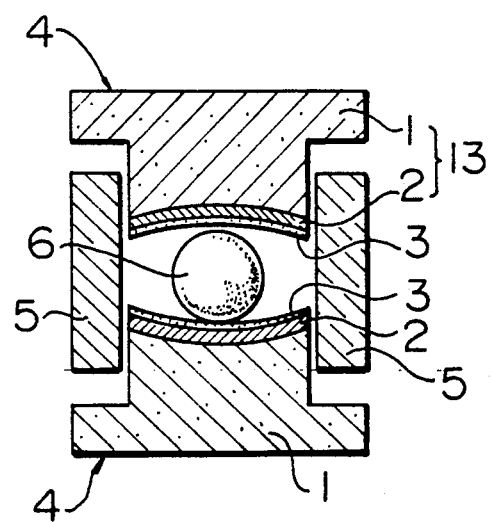
FIG. 2 is a schematic illustration showing an example of press molding of glass using a mold according to the process of the present invention.

Thus, there was formed a mold 4 for glass press molding of this Example which consisted of sintered SiC 1 having a given shape, a SiC film 2 formed on the press molding surface of the sintered SiC 1 according to a CVD method, and an i-carbon film 3 formed on the SiC film 2 according to an ion plating method, as show in FIG. 2.

Next, press molding of glass was effected using the mold obtained in this Example. As shown in FIG. 2, glass 6 consisting of glass A (lanthanum-based optical glass) was placed between a pair of molds 4 and 4 and a guide mold 5; the glass 6 was pressed at a 30 kgf/cm² at 560° C. (the glass had a viscosity of $10^9$ poises at this temperature) for 30 seconds in a nitrogen atmosphere to effect press molding, followed by rapid cooling to room temperature; the above procedure was repeated. As a result, the mold of this Example obtained by forming an i-carbon film of 600 Å in thickness on a SiC film showed no adhesion of glass even after 1,000 times of press molding; and the surface of the i-carbon film 3 showed no deterioration (see the description on releasability of mold sample Nos. 4–7 for glass A, in Example 1 of Table 1). In contrast, the mold of Reference Example having a SiC film but no i-carbon film showed adhesion of glass at the 5th to 9th press molding (see the description on releasability of mold sample Nos. 1–3 for glass A, in Reference Example of Table 1).

Also, glass B (barium-based optical glass) was subjected to press molding under the same conditions as above at 720° C. (the glass had a viscosity of $10^9$ poises at this temperature). In the case of the mold of this Example, three of the four mold samples tested showed adhesion of glass at the 625th to 891st press molding but, after removal of adhering glass with an ammonium hydrofluoride solution, enabled continued press molding; the remaining one mold sample showed no adhesion of glass even after 1,000 times of press molding (see the description on releasability of mold sample Nos. 104–107 for glass B, in Example 1 of Table 1).

In connection with the above press molding, there was measured a friction coefficient between (a) a SiC film formed on a mold base of dis shape according to a CVD method, or an i-carbon film formed on the SiC film according to the procedure of this Example and (b) glass of spherical shape to be press molded. The friction coefficient was 0.40 in the case of the SiC film and 0.10 in the case of the i-carbon film formed on the SiC film. Thus, the i-carbon film showed good lubricity for the glass to be press molded.

COMPARATIVE EXAMPLE 1a

An i-carbon film was formed on the same mold base as in Example 1 according to an ion plating method, using the same benzene gas and mold base temperature (300° C.) as in Example 1 but applying, between the mold base holder and the anode electrode, a voltage of 0.4 KV which was outside the range (0.5–2.5 KV) specified by the present invention.

Using the resulting mold with an i-carbon film, press molding of glass was effected in the same manner as in Example 1. In the case of glass A, the mold showed adhesion of glass at the 24th to 29th molding; in the case of glass B, the mold showed adhesion at the 20th to 26th molding (see the results of mold sample Nos. 8–9 and Nos. 108–109, in Comparative Example 1a of Table 1).

COMPARATIVE EXAMPLE 1b

An i-carbon film was formed on the same mold base as in Example 1 according to an ion plating method, using the same benzene gas as in Example 1 and applying the same voltage (1.0 KV) between the mold base holder and the anode electrode as in Example 1 but applying a mold base temperature of 80° C. which was outside the range (200°–400° C.) specified by the present invention.

Using the resulting mold with an i-carbon film, press molding of glass was effected in the same manner as in Example 1. In the case of glass A, the mold showed adhesion of glass at the 7th to 9th molding; in the case of glass B, the mold showed adhesion at the 2nd to 4th molding (see the results of mold sample Nos. 10–11 and Nos. 110–111, in Comparative Example 1b of Table 1).

COMPARATIVE EXAMPLE 1c

An i-carbon film was formed on the same mold base as in Example 1 according to an ion plating method, using the same benzene gas as in Example 1 and applying the same voltage (1.0 KV) between the mold base holder and the anode electrode as in Example 1 but applying a mold base temperature of 450° C. which was outside the range (200°–400° C.) specified by the present invention.

Using the resulting mold with an i-carbon film, press molding of glass was effected in the same manner as in Example 1. In the case of glass A, the mold showed adhesion of glass at the 87th to 93rd molding; in the case of glass B, the mold showed adhesion at the 41st to 45th molding (see the results of mold sample Nos. 12-13 and Nos. 112-113, in Comparative Example 1c of Table 1).

EXAMPLE 2

A test was conducted in the same manner as in Example 1 except that acetylene was used as a material gas in place of benzene. That is, the vacuum inside the vacuum chamber 11 was kept at $1.0 \times 10^{-3}$ Torr using acetylene gas, and then an i-carbon film of 600 Å in thickness was formed on the mold base 13 keeping the mold base temperature at 300° C. and applying a voltage of 1.0 KV between the mold base holder and the anode electrode and a voltage of 90 V between the anode electrode and the first cathode electrode. Next, using the resulting mold, press molding of glass was effected in the same manner as in Example 1. In the case of glass A, the mold showed no adhesion of glass and the i-carbon film showed no deterioration, even after 1,000 times of press molding (see the description on releasability of mold sample Nos. 14-17 for glass A, in Example 2 of Table 1). In the case of glass B, all of the four mold samples tested showed adhesion of glass at the 438th to 518th molding; the adhering glass was removed with an ammonium hydrofluoride solution. This caused slight surface roughening of i-carbon film at the portions where glass had adhered, but the continued press moldings gave no practical problem (see the description on releasability of mold sample Nos. 114-117 for glass B, in Example 2 of Table 1).

COMPARATIVE EXAMPLE 2a

An i-carbon film was formed on the same mold base as in Example 2 in accordance with an ion plating method using the same mold base temperature (300° C.) as in Example 2 and the same voltage (1.0 KV) between the mold base holder and the anode electrode as in Example 2 but using, in place of acetylene, acetone which was not specified by the present invention.

Using the resulting mold having an i-carbon film, press molding of glass was effected in the same manner as in Example 2. In the case of glass A, the mold showed adhesion of glass at the 87th to 114th molding; in the case of glass B, the mold showed adhesion at the 63rd to 91st molding (see the results of mold sample Nos. 18-19 ad No. 118-119, in Comparative Example 2a of Table 1).

COMPARATIVE EXAMPLE 2b

An i-carbon film was formed on the same mold base as in Example 2 in accordance with an ion plating method using the same mold base temperature (300° C.) as in Example 2 and the same voltage (1.0 KV) between the mold base holder and the cathode electrode as in Example 2 but using, in place of acetylene, methane gas which was not specified by the present invention.

Using the resulting mold having an i-carbon film, press molding of glass was effected in the same manner as in Example 2. In the case of glass A, the mold showed adhesion of glass at the 96th to 105th molding; in the case of glass B, the mold showed adhesion at the 53rd to 72nd molding (see the results of mold sample Nos. 20-21 and Nos. 120-121, in Comparative Example 2b of Table 1).

COMPARATIVE EXAMPLE 2c

An i-carbon film was formed on the same mold base as in Example 2 in accordance with an ion plating method using the same mold base temperature (300° C.) as in Example 2 and the same voltage (1.0 KV) between the mold base holder and the anode electrode as in Example 2 but using, in place of acetylene, pyridine which was not specified by the present invention.

Using the resulting mold having an i-carbon film, press molding of glass was effected in the same manner as in Example 2. In the case of glass A, the mold showed adhesion of glass at the 128th to 142nd molding; in the case of glass B, the mold showed adhesion at the 105th to 110th molding (see the results of mold sample Nos. 22-23 and Nos. 122-123, in Comparative Example 2c of Table 1).

EXAMPLES 3 and 4

A mold for glass press molding was obtained in the same manner as in Example 1 except that toluene (Example 3) or xylene (Example 4) was used as a material gas, in place of benzene.

Using the mold, press molding of glass was effected. Good results were obtained in Example 3 although they were slightly inferior to those of Example 1. That is, in the case of glass A, the mold showed no adhesion of glass up to at least 585th molding and, in the case of glass B, the mold showed no adhesion up to at least 402nd molding (see the description on releasability of mold sample Nos. 24-27 and Nos. 124-127 for glass, in Example 3 of Table 1).

Good results were obtained also in Example 4. In the case of glass A, the mold showed no adhesion of glass up to at least 581st molding and, in the case of glass B, the mold showed no adhesion up to at least 429th molding (see the description on releasability of mold sample Nos. 28-31 and Nos. 128-131 for glass, in Example 4 of Table 1).

EXAMPLE 5

A mold for glass press molding was obtained in the same manner as in Example 1 except that pentane was used as a material gas, in place of benzene.

Using the mold, press molding of glass was effected. Good results were obtained although they were slightly inferior to those of Example 1. That is, in the case of glass A, the mold showed no adhesion of glass up to at least 630th molding and, in the case of glass B, the mold showed no adhesion up to at least 490th molding (see the description of mold sample Nos. 32-35 and Nos. 132-135 for glass, in Example 5 of Table 1).

TABLE 1

| | | | Releasability | | | |
|---|---|---|---|---|---|---|
| | Mold obtained | Conditions for formation of i-carbon film | No. of mold sample | Glass A | No. of mold sample | Glass B |
| Reference Example | A mold obtained by forming a SiC film on sintered SiC | — | 1 | Adhesion at 7th molding | 101 | Adhesion at 2nd molding |
| | | | 2 | Adhesion at 5th molding | 102 | Adhesion at 5th molding |
| | | | 3 | Adhesion at 9th molding | 103 | Adhesion at 3rd molding |

TABLE 1-continued

| | Mold obtained | Conditions for formation of i-carbon film | No. of mold sample | Releasability Glass A | No. of mold sample | Glass B |
|---|---|---|---|---|---|---|
| | according to a CVD method | | | | | |
| Example 1 | A mold obtained by forming an i-carbon film on the mold of Reference Example | Benzene gas, 300° C., 1.0 KV, 600 Å (film thickness) | 4 | No adhesion after 1,000 times of molding | 104 | Adhesion at 625th molding |
| | | | 5 | No adhesion after 1,000 times of molding | 105 | Adhesion at 891st molding |
| | | | 6 | No adhesion after 1,000 times of molding | 106 | Adhesion at 719th molding |
| | | | 7 | No adhesion after 1,000 times of molding | 107 | No adhesion after 1,000 times of molding |
| Comparative Example 1a | A mold obtained by forming an i-carbon film on the mold of Reference Example | Benzene gas, 300° C., 0.4 KV, 600 Å | 8 | Adhesion at 24th molding | 108 | Adhesion at 20th molding |
| | | | 9 | Adhesion at 29th molding | 109 | Adhesion at 26th molding |
| Comparative Example 1b | A mold obtained by forming an i-carbon film on the mold of Reference Example | Benzene gas, 80° C., 1.0 KV, 600 Å | 10 | Adhesion at 7th molding | 110 | Adhesion at 2nd molding |
| | | | 11 | Adhesion at 9th molding | 111 | Adhesion at 4th molding |
| Comparative Example 1c | A mold obtained by forming an i-carbon film on the mold of Reference Example | Benzene gas, 450° C., 1.0 KV, 600 Å | 12 | Adhesion at 87th molding | 112 | Adhesion at 41st molding |
| | | | 13 | Adhesion at 93rd molding | 113 | Adhesion at 45th molding |
| Example 2 | A mold obtained by forming an i-carbon film on the mold of Reference Example | Acetylene gas, 300° C., 1.0 KV, 600 Å | 14 | No adhesion after 1,000 times of molding | 114 | Adhesion at 518th molding |
| | | | 15 | No adhesion after 1,000 times of molding | 115 | Adhesion at 438th molding |
| | | | 16 | No adhesion after 1,000 times of molding | 116 | Adhesion at 482nd molding |
| | | | 17 | No adhesion after 1,000 times of molding | 117 | Adhesion at 495th molding |
| Comparative Example 2a | A mold obtained by forming an i-carbon film on the mold of Reference Example | Acetone gas, 300° C., 1.0 KV, 600 Å | 18 | Adhesion at 87th molding | 118 | Adhesion at 63rd molding |
| | | | 19 | Adhesion at 114th molding | 119 | Adhesion at 91st molding |
| Comparative Example 2b | A mold obtained by forming an i-carbon film on the mold of Reference Example | Methane gas, 300° C., 1.0 KV, 600 Å | 20 | Adhesion at 105th molding | 120 | Adhesion at 53rd molding |
| | | | 21 | Adhesion at 96th molding | 121 | Adhesion at 72nd molding |
| Comparative Example 2c | A mold obtained by forming an i-carbon film on the mold of Reference Example | Pyridine gas, 300° C., 1.0 KV, 600 Å | 22 | Adhesion at 142nd molding | 122 | Adhesion at 105th molding |
| | | | 23 | Adhesion at 128th molding | 123 | Adhesion at 110th molding |
| Example 3 | A mold obtained by forming an i-carbon film on the mold of Reference Example | Toluene gas, 300° C., 1.0 KV, 600 Å | 24 | Adhesion at 652nd molding | 124 | Adhesion at 403rd molding |
| | | | 25 | Adhesion at 586th molding | 125 | Adhesion at 451st molding |
| | | | 26 | Adhesion at 723rd molding | 126 | Adhesion at 491st molding |
| | | | 27 | Adhesion at 594th molding | 127 | Adhesion at 485th molding |
| Example 4 | A mold obtained by forming an i-carbon film on the mold of Reference Example | Xylene gas, 300° C., 1.0 KV, 600 Å | 28 | Adhesion at 669th molding | 128 | Adhesion at 487th molding |
| | | | 29 | Adhesion at 631st molding | 129 | Adhesion at 430th molding |
| | | | 30 | Adhesion at 582nd molding | 130 | Adhesion at 515th molding |
| | | | 31 | Adhesion at 625th molding | 131 | Adhesion at 493rd molding |
| Example 5 | A mold obtained by forming an i-carbon film on the mold of Reference Example | Pentane gas, 300° C., 1.0 KV, 600 Å | 32 | Adhesion at 788th molding | 132 | Adhesion at 518th molding |
| | | | 33 | Adhesion at 716th molding | 133 | Adhesion at 503rd molding |
| | | | 34 | Adhesion at 631st molding | 134 | Adhesion at 491st molding |
| | | | 35 | Adhesion at 692nd molding | 135 | Adhesion at 520th molding |

As described above, according to the present process for producing a mold for glass press molding, there could be obtained a mold for glass press molding, having an i-carbon film superior in adhesion to mold base, hardness, lubricity, etc., by adopting, in the ion plating method to form an i-carbon film, a given hydrocarbon, given voltages, given temperature conditions, etc. In this mold for glass press molding, the i-carbon film is less susceptible to peeling and glass releasability is good even after many times of press molding. Therefore, the mold can be used for glass press molding over a long period of time.

What is claimed is:

1. A process for producing a mold used for obtaining a press molded glass article, which comprises a step of forming an i-carbon film on a mold base for obtaining a press molded glass article, according to an ion plating method, wherein said ion plating method is effected by, in an ion plating apparatus comprising an anode electrode, a first cathode electrode, a holder for holding said mold base and a reflector extending as far as the vicinity of the mold base holder in such a shape that it surrounds the two electrodes, applying a low voltage between the anode electrode and the first cathode electrode to generate a plasma of ions of a hydrocarbon having a C/H ratio of ⅓ or more, and further applying a voltage of 0.5-2.5 KV between the mold base holder and the anode electrode so that the mold base holder becomes a second cathode electrode relative to the anode electrode while keeping the reflector at the same potential as the first cathode electrode to accelerate the hydrocarbon ions to the direction of the mold base which is being kept at 200°-400° C.

2. A process according to claim 1, wherein an ion bombardment treatment is effected prior to the ion plating method.

3. A process according to claim 1, wherein the mold base has a SiC film formed according to a CVD method.

4. A process according to claim 1, wherein the hydrocarbon is selected from the group consisting of aromatic hydrocarbons, unsaturated hydrocarbons containing a triple bond, unsaturated hydrocarbons containing a double bond, and saturated hydrocarbons.

5. A process according to claim 1, wherein the low voltage applied between the anode electrode and the first cathode electrode is 50–150 V.

* * * * *